United States Patent
Alphenaar et al.

(10) Patent No.: US 6,194,303 B1
(45) Date of Patent: Feb. 27, 2001

(54) MEMORY DEVICE

(75) Inventors: Bruce Alphenaar; Zahid Ali Khan Durrani, both of Cambridge (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/082,302

(22) Filed: May 20, 1998

Related U.S. Application Data

(62) Division of application No. 08/544,752, filed on Oct. 18, 1995, now Pat. No. 5,811,832.

(30) Foreign Application Priority Data

Oct. 20, 1994 (GB) .................................................. 9421138

(51) Int. Cl.$^7$ .................................................. H01L 21/44
(52) U.S. Cl. .................................. 438/606; 438/141
(58) Field of Search ........................... 438/237, 60, 52, 438/31, 26, 328, 32, 141, 606, 30; 257/368; 357/12

(56) References Cited

U.S. PATENT DOCUMENTS

| 4,198,644 | * | 4/1980 | Esaki ............................ 357/12 |
| 5,017,973 | * | 5/1991 | Mizuta et al. ..................... 257/25 |
| 5,047,810 | * | 9/1991 | Chemla et al. .................... 257/25 |
| 5,243,198 | * | 9/1993 | Syme et al. ...................... 257/25 |
| 5,280,182 | * | 1/1994 | Waho ............................ 257/25 |
| 5,390,145 | * | 2/1995 | Nakusha et al. .................. 365/159 |
| 5,416,040 | * | 5/1995 | Beam, III et al. ................ 438/60 |
| 5,422,305 | * | 6/1995 | Seobough et al. ............... 437/126 |
| 5,438,539 | * | 8/1995 | Mori ............................ 365/159 |
| 5,447,873 | * | 9/1995 | Randall et al. ................... 257/25 |
| 5,455,451 | * | 10/1995 | Usogawa et al. ................. 257/30 |
| 5,521,402 | * | 5/1996 | Ohsawa ........................ 257/197 |
| 5,563,087 | * | 10/1996 | Shen et al. ..................... 438/52 |
| 5,629,546 | * | 5/1997 | Wu et al. ...................... 257/368 |

FOREIGN PATENT DOCUMENTS 0 320 110  6/1989 (EP) .
61-050359  3/1986 (JP) .

OTHER PUBLICATIONS

S. Wolf, Silicon Processing for the VLSI Era, vol. 1–Process Technology, pp. 56–58, Lattice Press, 1990.*
Resistance bi–stability in resonant tunneling diode pillar arrays (B.W. Alphenaar, Z.A.K. Durrani, A.P. Heberle and Wagner) Appl. Phys. Lett. 66 (10), Mar. 6, 1995, pp. 1234–1236.
Applied Solid State Science, Advances in Materials and Device Research (B. Abeles) Academic Press 1976 pp. 1–21.
High Speed Semiconductor Devices (Edited by S.M. Sze) A Wiley–Interscience Publication, John Wiley & Sons, Inc., pp. 466–475; pp. 115–121, no date.

* cited by examiner

Primary Examiner—Matthew Smith
Assistant Examiner—Calvin Lee
(74) Attorney, Agent, or Firm—Kenyon & Kenyon

(57) ABSTRACT

A memory device consists of an array of resonant tunnel diodes in the form of pillars which are formed by selective etching. Each pillar includes first and second barriers (B1, B2) disposed between terminal regions (T1, T2) and a conductive region (CR1) between the barriers. The diameter of the pillars is typically of the order of 20–50 nm and is sufficiently small that the device exhibits first and second relatively high and low stable resistive states in the absence of an applied voltage between the terminal regions. The device can be used as a non-volatile memory at room temperature.

9 Claims, 6 Drawing Sheets

MEMORY DEVICE

This is a division of application Ser. No. 08/544,752 filed Oct. 18, 1995, now U.S. Pat. No. 5,811,832.

FIELD OF THE INVENTION

This invention relates to a memory device and a method of fabrication thereof.

BACKGROUND

It is known that resonant tunnelling diodes (RTDs) exhibit a negative differential resistance characteristic which can be used as a memory. A recent review of RTDs given in F. Capasso, S. Sen and F. Beltram in High-Speed Semiconductor Devices edited by S. M. Sze, John Wiley & Sons, New York, 1990. Reference is also directed to EP-A-0297778. A typical RTD consists of a substrate with two overlying charge barriers spaced by a conductive region. Because the layers that make up the barriers and the well are very thin, fabricated on the nanometer scale, the device exhibits quantum conductivity effects and can exhibit different stable states each with a different resistance level. Switching between the states can be achieved by applying a predetermined voltage across the device. However, hitherto, such devices have required the continuous application of a bias voltage to maintain the different resistance states.

In accordance with the invention, there is provided a memory device comprising first and second terminal regions, first and second barrier means disposed between the terminal regions and a conductive region between the first and second barrier means, a dimensional extent of the barrier means and the conductive region being configured to be sufficiently small that the device exhibits first and second relatively high and relatively low stable resistive states in the absence of a voltage applied between the terminal regions.

In accordance with the invention, the memory device can be operated without the requirement for a continuous applied bias voltage.

The values of the resistive states is substantially greater than in the previously reported RTDs. The ratio of the value of the first and second states may lie within a range of 5:1 to 500:1. Typically, the ratio exceeds 250:1 at room temperature, which significantly exceeds a typical comparable value for the prior art of 10:1.

The invention also extends to a method of fabricating the memory device, which includes selectively etching a substrate formed with overlying layers that define the first and second barrier means and the conductive region so as to form pillars at least some of which are of a diameter for exhibiting the relatively high and low conductivity states in the absence of a voltage applied between the terminal regions.

The pillars typically have diameters within a range of 20 to 50 nm.

The first and second barrier means may comprise any suitable double barrier structure and one possible example comprises AlAs/GaAs heterojunctions. The conductive region between the barrier means may comprise a i-GaAs layer.

The etching process may be carried out by evaporating a metallic material such as gold onto the substrate to form a granular layer of discrete islands, and then plasma etching material between the islands so as to form the pillars. A conductive overlayer that bridges the pillars may be provided in order to make contact collectively with the first terminal regions. Connection to the second terminal regions may be achieved through the substrate by means of contact, e.g. AuGeNi that is annealed to the substrate.

BRIEF DESCRIPTION OF THE DRAWINGS

In order that the invention may be more fully understood an embodiment thereof will now be described by way of example with reference to the accompanying drawings, in which:

FIG. 6a is a graph of current versus bias voltage for a memory device according to the invention which is initially in a first relatively low resistance state and is then switched to a relatively high resistance state by increasing the bias voltage V;

FIG. 6b corresponds to FIG. 6a and illustrates that the device stays in the relatively low resistance state if the bias remains positive;

FIG. 6c illustrates that when the device is pulsed at −5V for one second, the device returns to its original condition;

DETAILED DESCRIPTION

Figure 2:
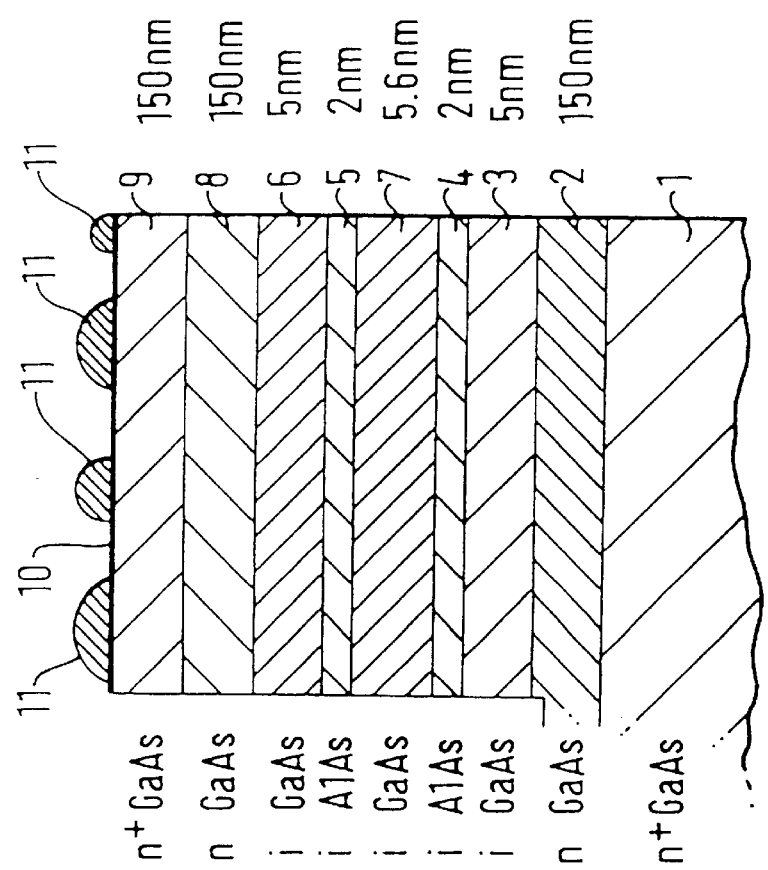
FIG. 2 is an electron beam micrograph of a pillar structure for use in a device according to the invention, at a magnification of 60,000.
Figure 1:
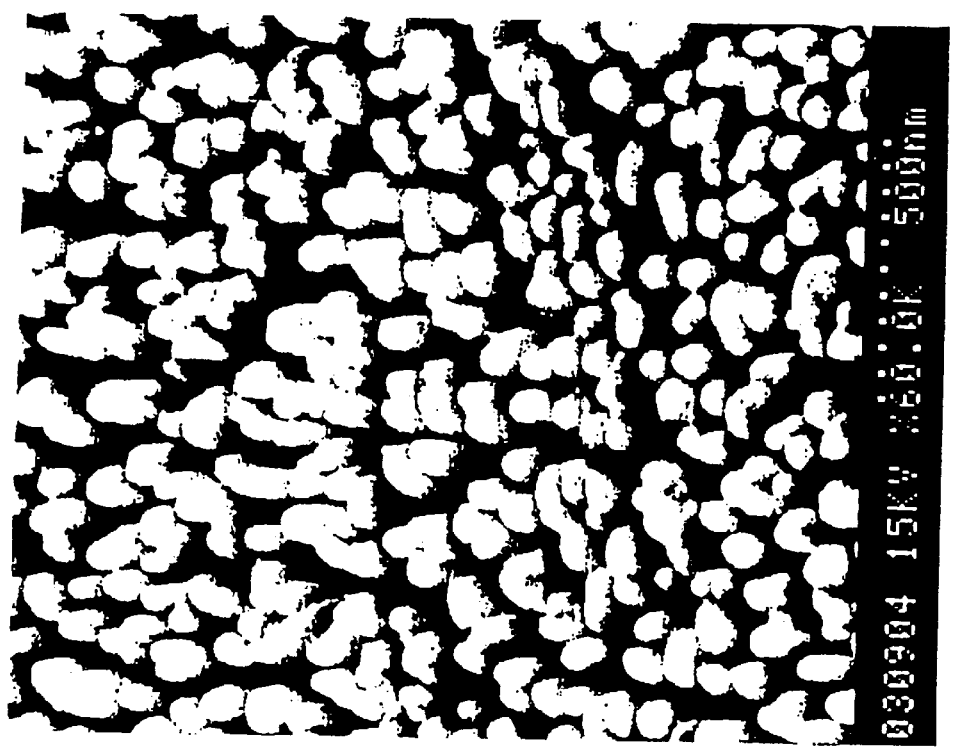
FIG. 1 is a sectional view through a substrate for use in forming a memory device according to the invention.
Figure 3:
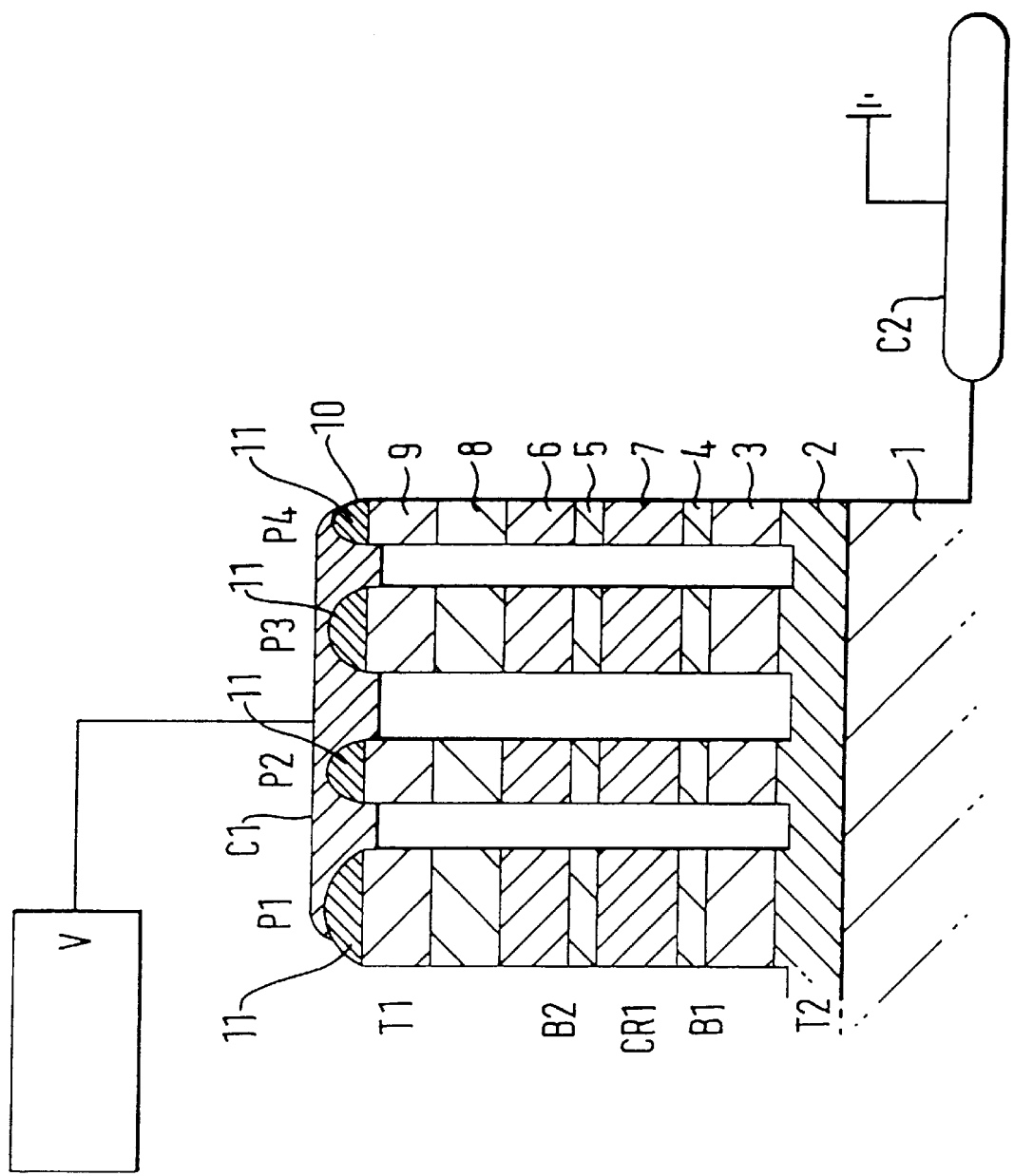
FIG. 3 is a schematic sectional view of a memory device in accordance with the invention, that utilizes pillars formed as shown in FIG. 2.

A memory device according to the invention is shown in FIG. 3 and makes use of a pillar array structure which is shown in the electron micrograph of FIG. 2. The pillars of the array are of a non-uniform diameter and each contains a RTD. The method of forming the pillar array will now be described with reference to FIG. 1.

A $n^+$GaAs substrate 1 is provided by conventional techniques, e.g., MBE or MOCVD, with a n GaAs layer 2, which itself is overlaid by i-GaAs layer 3 and an associated i-AlAs layer 4. The layers 3, 4 form a AlAs/GaAs heterojunction together constitute a first barrier region. An i-AlAs layer 5 and associated i-GaAs 6 form a second similar barrier region overlying the first. A conductive region of i-GaAs material 7 is disposed between the first and second barrier regions 3, 4; 5, 6. The second barrier region is overlaid by a n-GaAs layer 8 which itself is overlaid by a n$^+$GaAs layer 9.

In order to define the pillars, a thin metallic film is deposited onto the surface 10 of the semiconductor by an evaporation technique. In this example, gold is used, and for film thicknesses less than around 10 nm, the gold forms a granular layer composed of discrete islands as described in B. Abeles, Appl. Sold. Sci. 6, 1 (1976). The resulting gold islands 11 shown schematically in FIG. 1 partially mask the underlying material so that it can be selectively etched to form the pillars. In this example, the gold mask was approximately 5 nm thick and the sample was etched for three minutes in 10 mTorr SiCl$_4$/AR at a ratio of 1:2 with a power density of 4 mW/cm$^2$. This selectively removed the material between the dots and produced an array of semiconductor pillars as shown in FIG. 2. Due to the random dimensions of the dots 11, the pillars have a range of diameters and typically are in the range of 20 to 50 nm. The pillars thus formed typically have a height of 350 nm. Some of the pillars are partially interconnected to form larger structures. Typically, the pillar array extends over a sample surface of 5×5 mm, al though the sample size is not limited to this value by the fabrication procedure.

Referring now to FIG. 3, this shows an example of the memory device according to the invention. Four pillars P1–4 are shown, each of different diameter. Considering the pillar P1 by way of example, it includes first and second barrier regions B1, B2 formed from portions of the layers 3, 4 and 5, 6 respectively, the barrier regions being separated by a conductive region CR1 formed from a portion of layer 7. A first terminal region T1 comprising portions of layers 8, 9 overlies the barrier region B2, and a second terminal region formed of portions of layers 1, 2 underlies the first barrier region B1. A top contact C1 to the pillar array is constructed by evaporating a 30×30 micron gold pad so to form a conductive region which bridges the pillars P to provide a contact collectively to their first terminal regions. Collective contact is made to the second terminal regions by means of a back contact C2 which is annealed onto the substrate 1. In this embodiment, the back contact is formed of AuGeNi and is annealed at 400° C. for 10 seconds.

Figure 4:
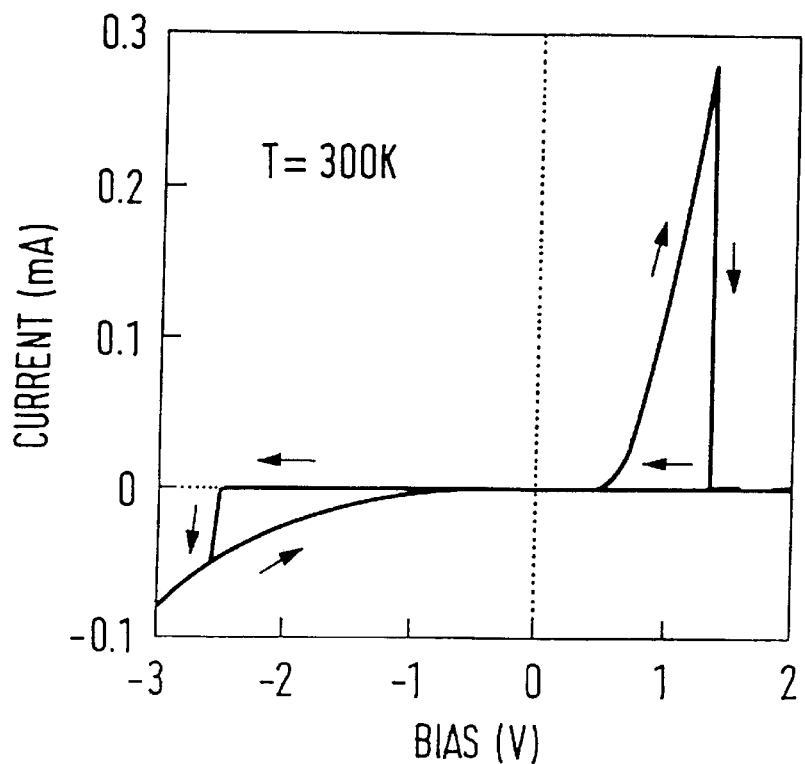
FIG. 4 illustrates current-voltage characteristic across the terminals of the device shown in FIG. 3.

In use, a voltage V is applied between the contacts C1 and C2 from a variable source (not shown in detail). The current through the device as a function of the bias voltage V, is shown in FIG. 4, and exhibits hysteresis. Starting at zero bias voltage V, the device is initially in a high resistance state. As the bias voltage V is moved negatively, the current jumps sharply at −2.4 V and the device takes up a low resistance state. The device stays in the low resistance state until the bias crosses zero and increases to 1.4 V. Here the device switches back to the high resistance state and the ratio of the current peak for the high resistance state to the current valley for the low resistance state, is typically in excess of 250:1 and with a typical maximum value of 500:1. By way of comparison, RTDs constructed according to the prior art (i.e. without pillar formation) showed a room temperature peak to valley ratio of 3:1 with no hysteretic switching behaviour. By room temperature, we mean a temperature of 300° K.±10° K.

Figure 5:
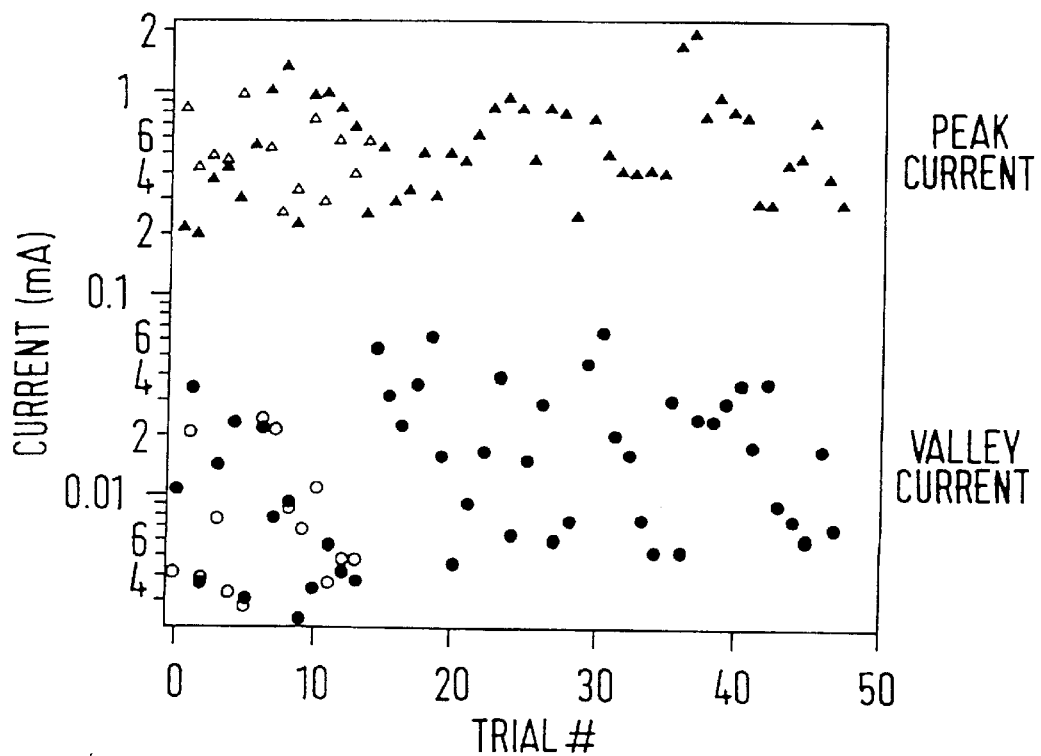
FIG. 5 is a plot of the peak current and valley current associated with the relative low and high resistance states of the device shown in FIG. 2, the current being plotted on a logarithmic scale for 50 trials, for two different devices.

In order to test the stability and reproducibility of the results shown in FIG. 4, a series of hysteresis measurements were made on two different devices and the results are shown in FIG. 5. The current in the low resistance state (labelled peak current) is compared with the current in the high resistance state (labelled valley current) measured at a bias of 1 V following a particular switching event. The results from the first device under test as shown as solid triangles for the peak current and solid circles for the valley current. The device exhibited a large variability in both the peak and valley currents. However, the peak to valley ratio of the device never dropped below 5:1 and sometimes was as high at 400:1. After 50 trials, no degradation in device performance was observed. The second device having its peak and valley currents shown as open triangles and circles, was tested for comparison over 13 trials. The peak and valley currents lie within the same set of values as the first device and no degradation was observed.

Figure 6:
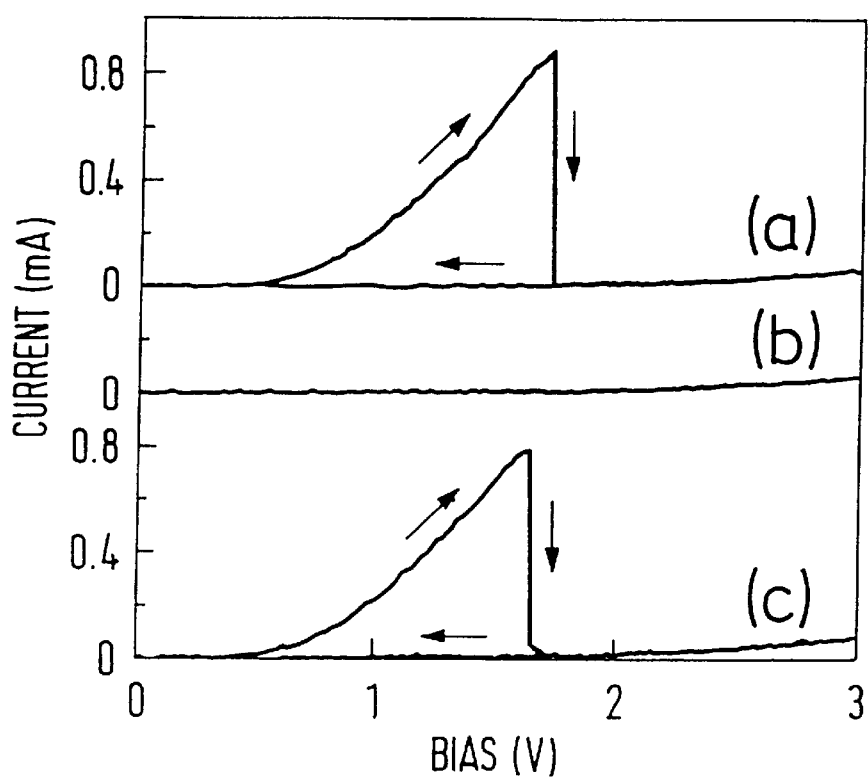
FIG. 6 is a graph showing three different conditions of the memory device.

The device can thus be used as a zero-bias two-terminal memory device which exhibits a non-volatile characteristic at room temperature. The low resistance state can represent one stored bit of information, which can be erased by switching the device into the high resistance state. The process is demonstrated in FIG. 6. Starting at zero bias in the low resistance state, as shown in FIG. 6a, the device switches to the high resistance state at 1.7.V. This corresponds to erasing the previously stored information. Thereafter, the bias voltage V was switched off for 10 minutes and then the state of the device was probed by applying a positive voltage, and measuring a resistance. The results are shown in FIG. 6b where the current remains low as the bias voltage V is increased. Information can be restored by applying a large enough negative bias −V, which switches the device to the low resistance state. FIG. 6c shows the same trace taken after pulsing the device with −5V for one second. The original characteristics (FIG. 6a) are reproduced, thus indicating the storage of an information bit. Further measurements show that the high resistance state remains stable at zero-bias for an unlimited time, while the low resistance is stable for at least one hour before eventually switching to the high resistance state.

Figure 7:
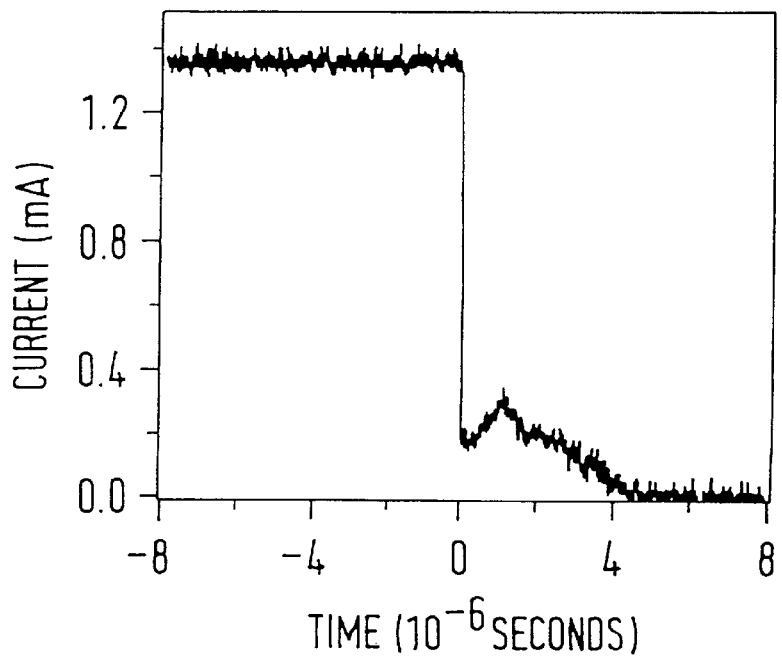
FIG. 7 is a graph of the current through the device as a function of time as the device switches between the low and high resistance states.

The theory of operation of the device is not fully understood and the following discussion is presented by way of non-limiting explanation. It is believed that trapped charge in the well between the barrier regions B1, B2 has a strong influence on the energy of the resonant level for the well formed between the barriers. In the low resistance state, the resonant level is accessible. However, as the bottom of a conduction band moves through the resonance energy, as the bias voltage V is increased, the trapped charge escapes. This switches the device to the high resistance state. If the switching behaviour is due to a resonant process, it is to be expected that the switching time should be similar to that observed in a typical resonant tunnelling device. In FIG. 7, it can be seen that the current as a function of time, as the device switches from the low to the high resistance state, falls in less than $10^{-7}$ seconds, and is then followed by a slower exponential decay. This suggests an initial resonant switch followed by a slower discharging of the trapped states.

Figure 8A:
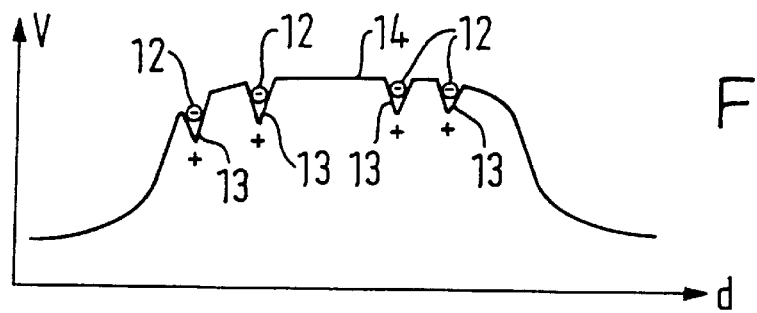
FIG. 8a illustrates the potential across the diameter of a charging pillar $P_{ch}$.
Figure 8B:
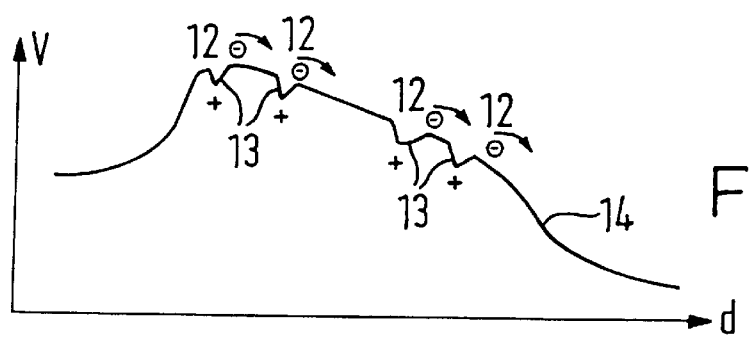
FIG. 8b illustrates the charging potential when a bias voltage V greater than the pillar depletion voltage $V_D$ is applied.

The aforementioned range of pillar diameter has an effect on the characteristics of the device. The smallest diameter pillars, referred to herein as charging pillars $P_{ch}$, e.g with a diameter d of 20 nm (or less), contain only a small number of dopant atoms due to the small pillar size, and, as shown in FIG. 8a, electrons 12 in the charging pillars are initially trapped in wells 13 created by the donor atoms in a non-uniform potential 14.

Figure 9:
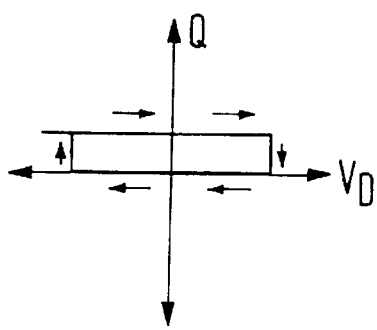
FIG. 9 illustrates the level of charge in the charging pillar as a function of applied voltage V.
Figure 10:
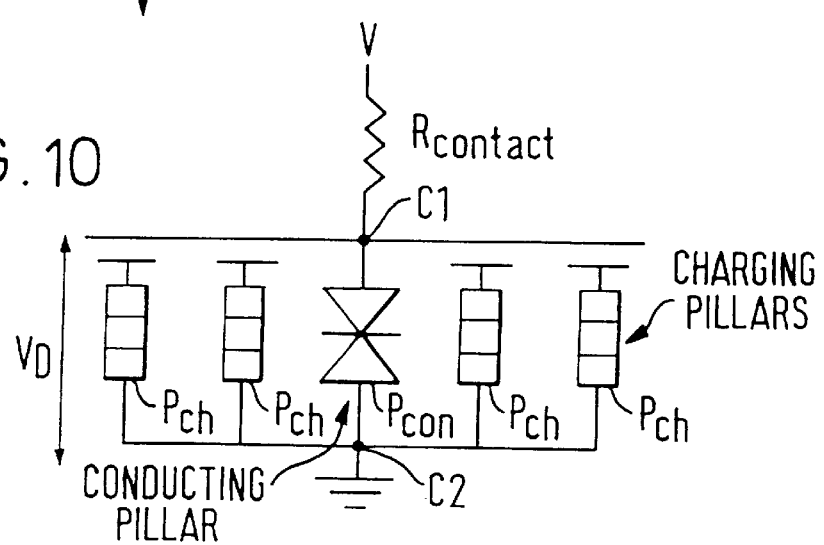
FIG. 10 is a schematic equivalent circuit diagram of a device in accordance with the invention.

The charging pillars thus exhibit a depletion potential $V_D$ and the application of a large negative bias V forces the trapped electrons 12 over the depletion potential and out of the wells 13 so that the pillars become charged positively. FIG. 9 shows the charge in one of the charging pillars as a function of applied bias voltage V. The trace is hysteretic, because charge is unable to re-enter the pillar until the relatively large depletion potential $V_D$ is surmounted. In contrast, a small amount of current can flow through pillars of larger diameter that are not completely depleted, which are referred to herein as conducting pillars $P_{con}$. The device comprises a large number of charging pillars $P_{ch}$ and a small number of conducting pillars $P_{con}$, and the equivalent circuit diagram can be represented as shown in FIG. 10, with the charging pillars $P_{ch}$ being connected in parallel with the conducting pillars $P_{con}$, which have the characteristic of a resonant diode. The series resistance associated with the contacts C1,C2 (FIG. 3) is shown schematically as $R_{contact}$. When the charging pillars $P_{ch}$ switch to a positively charged state, the potential barrier in the conducting pillars $P_{con}$ drops down, and the resistance increases. This gating of the conducting pillars $P_{con}$ by the charging pillars $P_{ch}$ results in the experimentally observed current voltage characteristic shown in FIG. 4.

Figure 11:
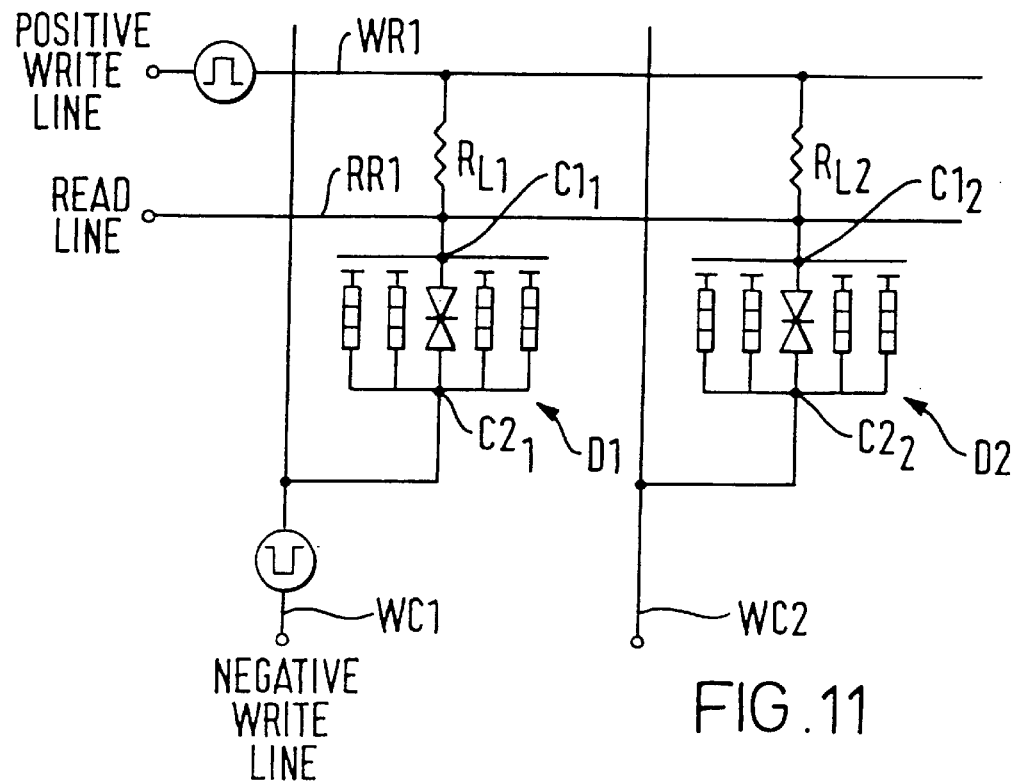
FIG. 11 illustrates schematically a first example of an array of memory devices in accordance with the invention.

An example of how devices according to the invention can be connected in a memory array will now be described. Referring to FIG. 11, individual memory devices as shown in FIG. 10 are illustrated as devices D1, D2 that are series connected with load resistors $R_{L1}$, $R_{L2}$. The lowermost contacts $C1_1$, $C1_2$ are connected to respective column write lines WC1, WC2 that receive negative going write pulses respectively. The lines WC1, WC2 are in effect column lines for a matrix of the memory cells. A positive going write row line WR1 is connected to the uppermost terminals $C1_1$ and $C2_1$ through the load resistors $R_{L1}$ and $R_{L2}$. In order to write data to a particular memory cell, the positive going write line WR3 is energized with a positive going pulse and, simultaneously, a negative going pulse is applied to one of the negative going column write lines WR1 or 2. For example, when device D1 is to be written with data, the line WR1 is energized so that a voltage level greater than $V_D$ is applied to the device, thereby writing data to the memory cells. The application of successive simultaneous positive and negative going write pulses, successively switches the memory cell D1 between the on and off state. However, for the cell D2, the positive write pulse on line WR1 is insufficient to flip the state of device D2 and so data is written selectively to the cell D1. Conversely, if a negative pulse was applied selectively to column line WR2, data would be written selectively to cell D2.

Data can be read from the cells individually by applying a reading voltage to one of the lines WC1, WC2 selectively and monitoring the current flowing on read line RR1. The voltages are selected to be less than that required to flip the state of the cell, so that data is read non-destructively.

Figure 12:
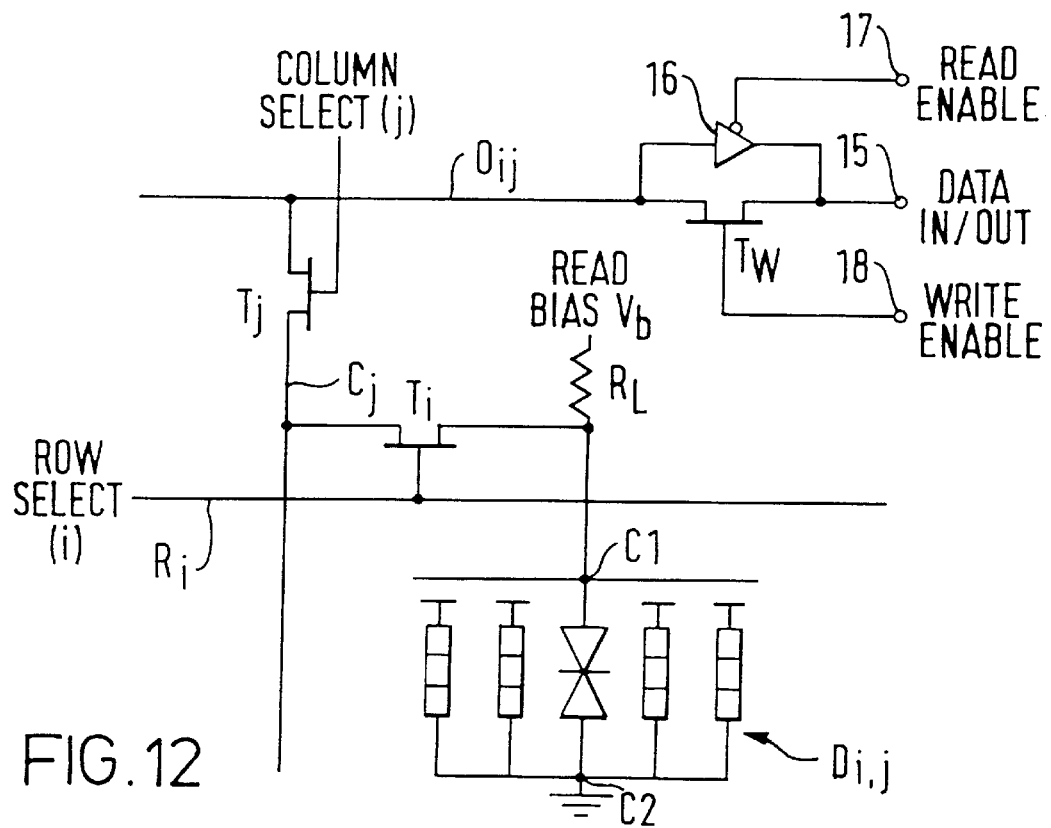
FIG. 12 illustrates a memory cell with an alternative read/write arrangement.

Referring now to FIG. 12, the device D1 for an individual cell of the memory can also be integrated into a more conventional memory array, in which an individual cell is selected using transistors in series with the row and column lines. In more detail, the device for a particular memory cell, shown as device D is coupled to a load resistance $R_L$ and has associated row and column lines $R_i$ and $C_j$. A transistor $T_i$ is switched on by a signal applied to row line $R_i$ and a particular column is selected by means of transistor $T_j$ operated by a column select signal j fed to its gate. Thus, when a particular row and column i, j is selected, the output from terminal regions C1 of device $D_{ij}$ is coupled to a data input/output line $O_{ij}$. A read bias $V_b$ is applied to the device $D_{ij}$ through the load resistance $R_L$ and the second terminal region C2 is earthed. The resulting output on line $O_{ij}$ corresponding to the state of the memory device $D_{ij}$ is fed out to a data input/output terminal 15 through amplifier 16, which is switched on by a read enable pulse applied to terminal 17.

In order to write data to the cell, a transistor $T_w$ is switched on by means of a write enable pulse applied to terminal 18 so that data can be applied at terminal 15. The voltage level for the data is chosen to be higher than $V_D$ so as to flip the state of the cell $D_{ij}$.

It will be understood that for the devices shown in FIGS. 11 and 12, the memory cells such as D1 and D2 are formed on a common substrate with common overlying layers which provide the first and second barrier means and the conductive region, so that for each cell the substrate and said overlying layers are formed into a plurality of pillars at least some of which are of a diameter for exhibiting relatively high and low conductivity states in the absence of a voltage applied between the terminal regions.

Thus, the device described herein can be used as a non-volatile memory at room temperature and can be switched between its stable states by appropriately pulsing the bias voltage V. Alternative switching means, for switching the device between the states may be possible, for example, additional electrode structures or other processes.

What is claimed is:

1. A method of fabricating a memory device from a substrate formed with overlying layers that provide a conductive region between first and second barrier means, the method comprises selectively etching the substrate so as to form a plurality of pillars at least some of which are of a diameter which is sufficiently small that the device exhibits first and second relatively high and relatively low stable resistive states in the absence of a voltage applied across said barrier means in the pillars.

2. A method according to claim 1 including evaporating a metallic material onto the substrate such as to form a granular layer of discrete islands, and plasma etching material between the islands to form the pillars.

3. A method according to claim 2 including forming by vapour deposition a conductive overlayer that bridges the pillars to provide a contact collectively to a first terminal region.

4. A method according to claim 1, including attaching a contact to the substrate so as to provide a collective electrical connection to the second terminal regions of the pillars.

5. A method according to claim 4 wherein the contact is of AuGeNi and is annealed to the substrate.

6. A method according to claim 1, wherein the substrate is of GaAs material and prior to the etching is formed with first and second overlying GaAs/AlAs heterojunctions spaced by a i-GaAs layer.

7. A method according to claim 1 including arranging the pillars in a plurality of memory cells, arranged in a plurality of rows and columns to be addressed individually for reading data therefrom and writing data thereto.

8. A method of fabricating a non-volatile memory device from a substrate formed with overlying layers that provide a conductive region between first and second barrier means, the method comprising selectively etching the substrate so as to form a plurality of pillars at least some of which are of a diameter which is sufficiently small that the device exhibits first and second relatively high and relatively low stable resistive states in the absence of a voltage applied across said barrier means in the pillars.

9. A method of fabricating a memory device from a substrate formed with overlying layers that provide a conductive region between first and second barrier means, the method comprising selectively etching the substrate so as to form a plurality of pillars at least some of which are of a diameter less than 50 nm and so the device exhibits first and second relatively high and relatively low stable resistive states in the absence of a voltage applied across said barrier means in the pillars.

* * * * *